United States Patent
Bae (10) Patent No.: US 7,701,257 B2
(45) Date of Patent: Apr. 20, 2010

(54) DATA RECEIVER AND SEMICONDUCTOR DEVICE INCLUDING THE DATA RECEIVER

(75) Inventor: Seung-Jun Bae, Daejeon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 134 days.

(21) Appl. No.: 11/870,482

(22) Filed: Oct. 11, 2007

(65) Prior Publication Data

US 2008/0089155 A1    Apr. 17, 2008

(30) Foreign Application Priority Data

Oct. 16, 2006    (KR) ............ 10-2006-0100513

(51) Int. Cl.
*G01R 19/00* (2006.01)
*G11C 7/00* (2006.01)
*H03F 3/45* (2006.01)

(52) U.S. Cl. .................. 327/55; 327/57
(58) Field of Classification Search ............. 327/51, 327/52, 55–57

See application file for complete search history.

(56) References Cited

U.S. PATENT DOCUMENTS

| 5,272,674 | A | | 12/1993 | Pathak et al. |
| 5,933,459 | A | * | 8/1999 | Saunders et al. ............ 375/317 |
| 6,058,059 | A | | 5/2000 | Huang et al. |
| 7,397,848 | B2 | * | 7/2008 | Stojanovic et al. ........ 375/229 |
| 2002/0053938 | A1 | * | 5/2002 | Tran et al. ................. 327/408 |

FOREIGN PATENT DOCUMENTS

| JP | 06-060672 A | 3/1994 |
| JP | 09-198869 A | 7/1997 |

* cited by examiner

*Primary Examiner*—Quan Tra
(74) *Attorney, Agent, or Firm*—Volentine & Whitt, PLLC

(57) ABSTRACT

The invention is directed to data receivers such as those used in semiconductor devices. Embodiments of the invention provide a loop unrolling DFE receiver that uses analog control signals from each equalizer to avoid timing delays associated with the use of latched digital control signals in the conventional art. In addition, embodiments of the invention implement each equalizer with a single sense amplifier based flip flop (SAFF) to reduce circuit size and power consumption.

20 Claims, 7 Drawing Sheets

DATA RECEIVER AND SEMICONDUCTOR DEVICE INCLUDING THE DATA RECEIVER

BACKGROUND OF THE INVENTION

1. Field of the Invention

The present invention relates generally to a data receiver, and more particularly, but not by way of limitation, to a data receiver of a semiconductor device.

This application claims the benefit of Korean Patent Application No. 10-2006-0100513, filed on Oct. 16, 2006, in the Korean Intellectual Property Office, the disclosure of which is incorporated herein in its entirety by reference.

2. Description of the Related Art

The data transmission speed between semiconductor chips has increased. However, in the improvement of system performance, the increase of the data transmission speed is restricted due to the physical limit of a channel. A transmission line on a printed circuit board (PCB) has a feature of a low pass filter. Accordingly, when a data signal is transmitted at a speed of several gigabits per second (Gb/s), a gain of the transmitted data signal through the transmission line decreases, and inter symbol interference (ISI) of the transmitted data signal is generated.

Also, the ISI is generated by a reflection wave due to the discontinuation of impedance on the channel. In particular, the ISI becomes more severe on a dynamic random access memory (DRAM). This is because the signal transmission method of the DRAM is a single ended signaling method and the ISI may increase due to a multi load and a connector.

An equalizer may be used to remove the ISI. The equalizer includes a pre-conditioner at a transmission end, a linear equalizer at a receiving end, and a decision feedback equalizer (DFE). In particular, the DFE is widely used because it does not amplify a high frequency noise. A DFE receiver of a DRAM using the DFE method removes the ISI from the currently received signal based on a previously input data value. The DFE receiver can be embodied in many ways and, as an example, there is a method in which the ISI is removed by changing a reference voltage of a receiver.

Figure 1:
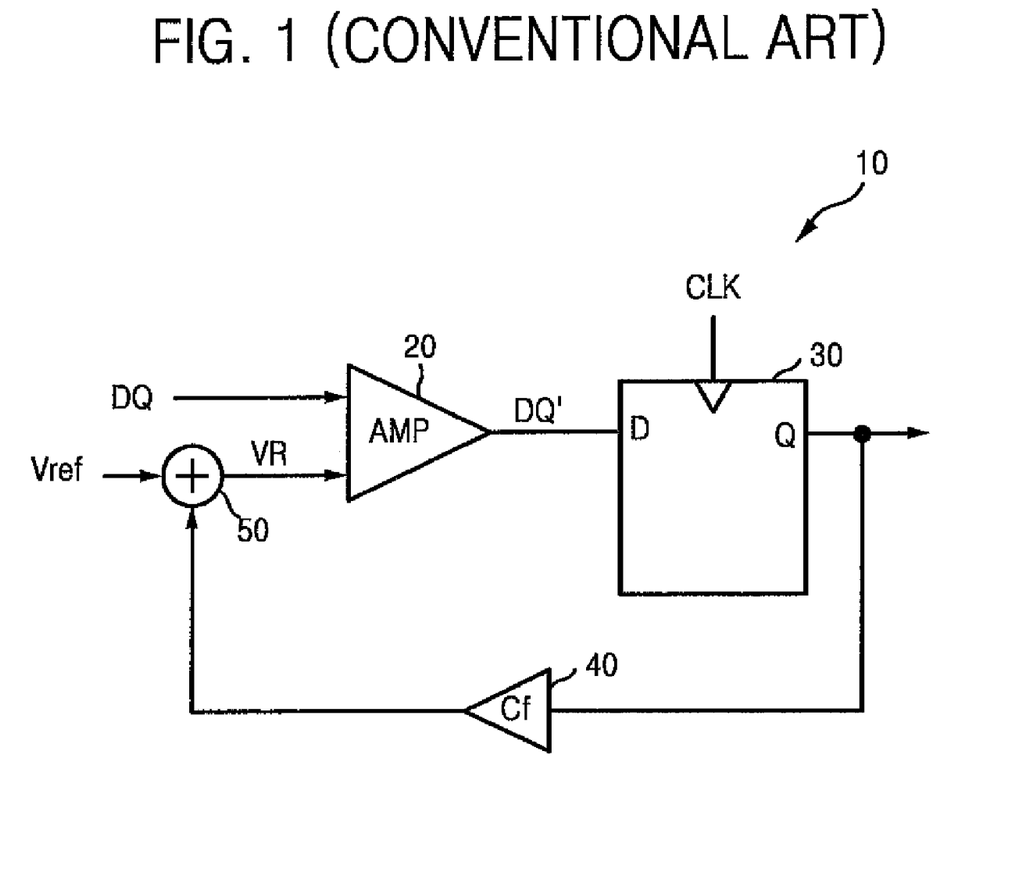
FIG. 1 is a circuit diagram of a single tap DFE receiver in the conventional art.

FIG. 1 is a circuit diagram of a single tap DFE receiver for removing ISI by changing a first reference voltage VR of a receiver 10. Referring to FIG. 1, the receiver 10 includes an amplifier 20, a latch 30, a tap 40, and an adder 50. The amplifier 20 receives a first data signal DQ and outputs a second data signal DQ' based on the input first data signal DQ and the first reference voltage VR. The latch 30 latches the second data signal DQ' in response to a clock signal CLK. A coefficient Cf of the tap 40 is updated based on the second data signal DQ' latched in the latch 30. The adder 50 is added the updated coefficient Cf of the tap 40 and a second reference voltage Vref. The output of the adder 50 is the first reference voltage VR.

Figure 2:
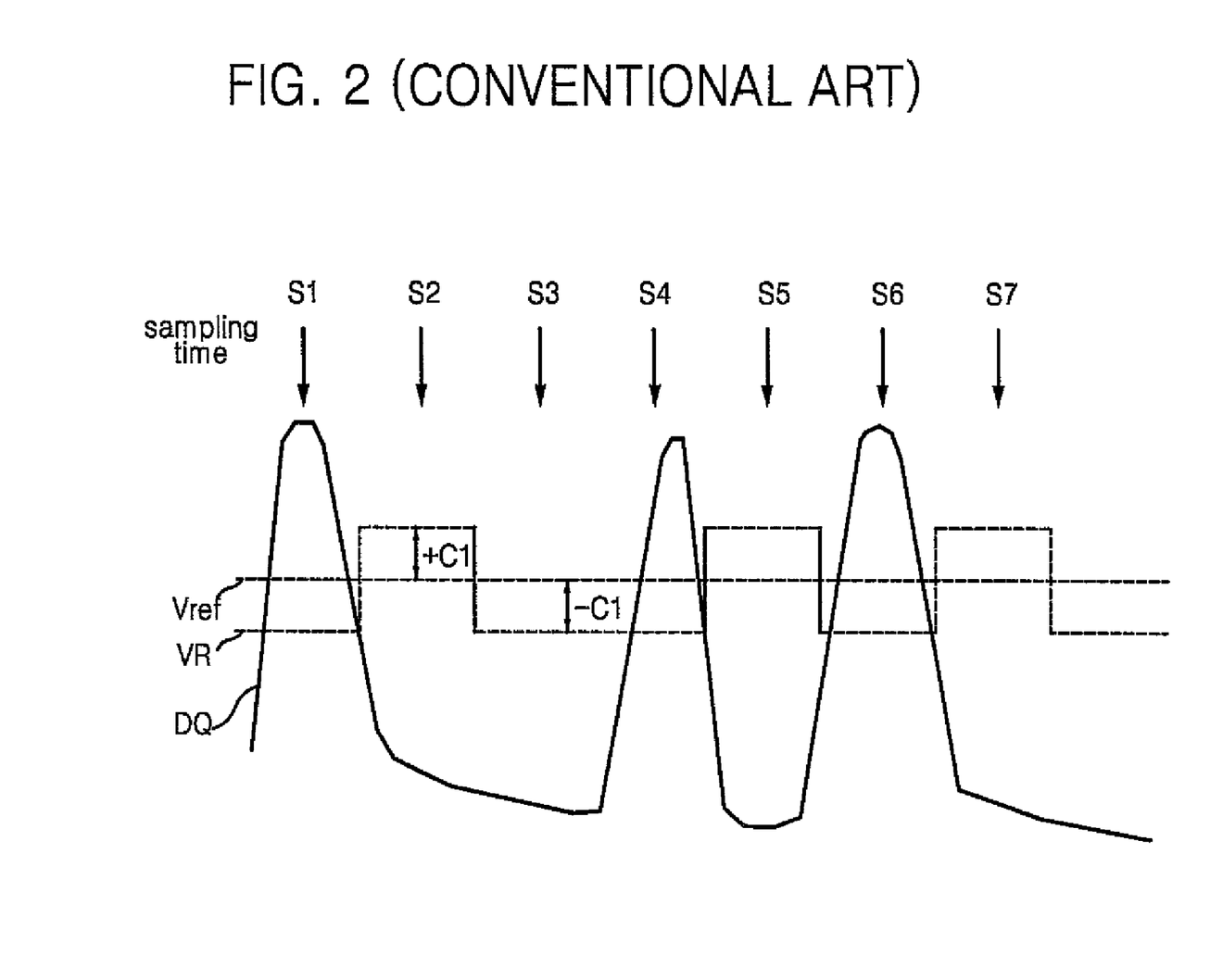
FIG. 2 is a timing diagram illustrating the operation of the single tap DFE receiver of FIG. 1.

FIG. 2 is a conceptual view for explaining the operation of the single tap DFE receiver 10 of FIG. 1. Referring to FIG. 2, the input data DQ (for example, the first data signal of FIG. 1) is sampled at predetermined sampling times S1 through S7 in response to the clock signal CLK. When a value of the data DQ input in a previous sampling time (for example, the data sampled at time S3) is in a low level, gain of the present data DQ, (for example, the data sampled at time S4) may be decreased due to the ISI. In this case, the tap 40 determines the coefficient Cf (=−C1) based on the data value input at the previous sampling time. For example, the data value sampled at time S3 is in a low level (DQ=low). The adder 50 adds the determined coefficient −C1 of the tap 40 and the second reference voltage Vref.

The amplifier 20 determines the present data value based on a result of comparison between the output VR (=Vref−C1) of the adder 50 and a value of the present data DQ (i.e., the data value sampled at time S4). Also, the coefficient Cf (=+C1) of the tap 40 is determined based on the data value of the input data DQ at a previous sampling time, for example, the data value sampled at time S1 (DQ=high). Thus, the first reference voltage VR=Vref+C1. Accordingly, the single tap DFE receiver 10 removes noise due to the ISI during the determination of the present data by controlling the reference voltage VR based on an input data value at a previous sampling time.

However, in the single tap DFE receiver 10, the feedback loop that includes tap 40 causes delay. The maximum operation speed of a semiconductor device (for example a DRAM) is thus limited. To address the above problem, a loop unrolling DFE method may be used for the receiver.

The loop unrolling DFE method is an unrolling method for reducing the feedback delay. In the loop unrolling DFE method, two comparison blocks are used to make two decisions for each data cycle, and one of the two decisions is selected as a final data output value based on the data value determined in a previous cycle.

Figure 3:
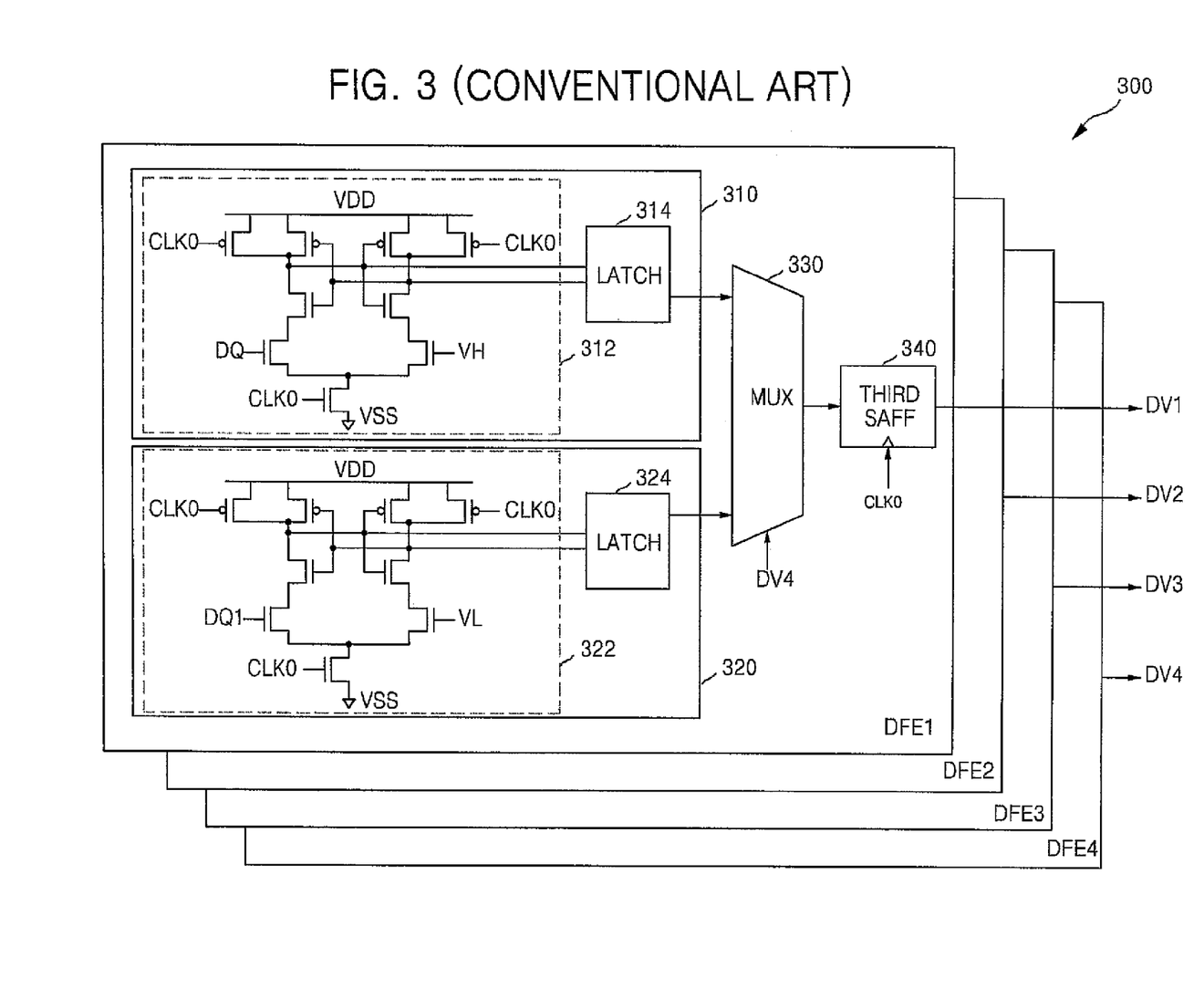
FIG. 3 is a circuit diagram of the conventional loop unrolling DFE receiver according to the conventional art.

FIG. 3 is a circuit diagram of a conventional loop unrolling DFE receiver 300. Referring to FIG. 3, the loop unrolling DFE receiver 300 uses a four interleaved method for determining input data DQ based on four clock signals CLK0, CLK90, CLK180, and CLK270, each clock having a phase difference of about 360°/4, that is, 90°. The receiver 300 includes a first equalizer DFE1, a second equalizer DFE2, a third equalizer DFE3, and a fourth equalizer DFE4. Each of the first through fourth equalizers DFE1-DFE4 has the same structure except for input and output signals.

The first through fourth equalizers DFE1-DFE4 determine data values DV1, DV2, DV3, or DV4 of the input data DQ based on the respective first through fourth clock signals CLK0, CLK90, CLK180, and CLK270, each of the clocks having a different phase. For example, the clock signals CLK90, CLK180, and CLK270 of the second through fourth equalizers DFE2, DFE3, and DFE4 have phase differences of 90°, 180°, and 270° compared to the phase of the clock signal CLK0 of the first equalizer DFE1. As a result, each of the equalizers DFE1 through DFE4 sequentially determines the input data DQ based on each of the clock signals CLK0 through CLK270, respectively, and outputs determined data values DV1 through DV4.

Equalizer DFE1 includes a first SAFF (sense amplifier-based flip flop) 310, a second SAFF 320, a multiplexer (MUX) 330, and a third SAFF 340. The first SAFF 310 includes a first differential amplifier 312 and a first latch 314. The first differential amplifier 312 differentially amplifies the difference between the input data DQ and the first voltage VH (a high level voltage), based on the first clock signal CLK0. The first latch 314 latches the output of the first differential amplifier 312.

The second SAFF 320 includes a second differential amplifier 322 and a second latch 324. The second differential amplifier 322 differentially amplifies the difference between the input data DQ and the second voltage VL (a low level voltage) based on the first clock signal CLK0. The second latch 324 latches the output of the second differential amplifier 322.

The multiplexer 330 outputs one of the outputs of the first latch 314 and the second latch 324 based on the value DV4 of the data DQ determined by the fourth equalizer DFE4.

The third SAFF 340 detects the output of the multiplexer 330, amplifies the detected signal, and outputs the amplified signal as a determined data value DV1 based on the first clock signal CLK0. Thus, the data value DV1 output by the first equalizer DFE1 is determined in part by the data value DV4 output by the fourth equalizer DFE4 in a previous cycle. For example, when the value of the data DQ determined by the fourth equalizer DFE4 is at a high level, the multiplexer 330 of the first equalizer DFE1 selects the output of the first latch 314. In this instance, the data value DV1 output from the first equalizer DFE1 is then determined based on the result of comparison between the input data DQ and the first reference voltage VH, (a high level voltage).

In contrast, when the value of the data DQ determined by the fourth equalizer DFE4 is at a low level, the multiplexer 330 of the first equalizer DFE1 selects the output of the second latch 324. In this instance, the data value DV1 output from the first equalizer DFE1 is determined based on the result of comparison between the input data DQ and the second reference voltage VL (a low level voltage).

The maximum operation speed of the semiconductor device having the loop unrolling DFE receiver 300 of FIG. 3 is limited by the time consumed by the latches 314 and 324 and the multiplexer 330. Also, since each of the equalizers DFE1 through DFE4 include three SAFFs, a DRAM or other semiconductor using the DFE receiver 300 has large circuit size and high power consumption. Therefore, there is a need to reduce the circuit size and power consumption of the conventional loop unrolling DFE receiver and decrease time delay during the data determination.

SUMMARY OF THE INVENTION

To solve the above and/or other problems, the embodiments of the present invention provide a loop unrolling DFE receiver that uses analog control signals from each equalizer to avoid timing delays associated with the use of latched digital control signals in the conventional art. In addition, embodiments of the invention implement each equalizer with a single sense amplifier based flip flop (SAFF) to reduce circuit size and power consumption. In embodiments of the invention, the data receiver may be used in a semiconductor device such as a DRAM.

An embodiment of the invention provides a data receiver comprising a plurality of equalizers, each of the plurality of equalizers including: a sense amplifier configured to selectively sense and amplify a difference between input data and a first reference voltage or a difference between the input data and a second reference voltage in response to a clock signal and a plurality of control signals; and a latch coupled to the sense amplifier and configured to latch an output signal of the sense amplifier, the plurality of control signals being output signals of the sense amplifier included in another one of the plurality of equalizers.

Another embodiment of the invention provides a semiconductor device having a plurality of the data receivers with the aforementioned features.

Another embodiment of the invention provides A data receiver having a plurality of equalizers, each of the plurality of equalizers having a sense amplifier and a latch, the sense amplifier comprising: a first differential amplifier configured to amplify a difference between input data and a first reference voltage; a second differential amplifier configured to amplify a difference between the input data and a second reference voltage; and a selection circuit coupled to the first differential amplifier and the second differential amplifier, the selection circuit configured to activate the first differential amplifier based on a first control signal from another one of the plurality of equalizers and a clock signal, the selection circuit configured to activate the second differential amplifier based on a second control signal from the other one of the plurality of equalizers and the clock signal.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

The attached drawings for illustrating embodiments of the present invention are referred to in order to gain a sufficient understanding of the present invention, the merits thereof, and the objectives accomplished by the implementation of the present invention.

Hereinafter, the present invention will be described in detail by explaining embodiments of the invention with reference to the attached drawings. Like reference numerals in the drawings denote like elements.

Figure 4:
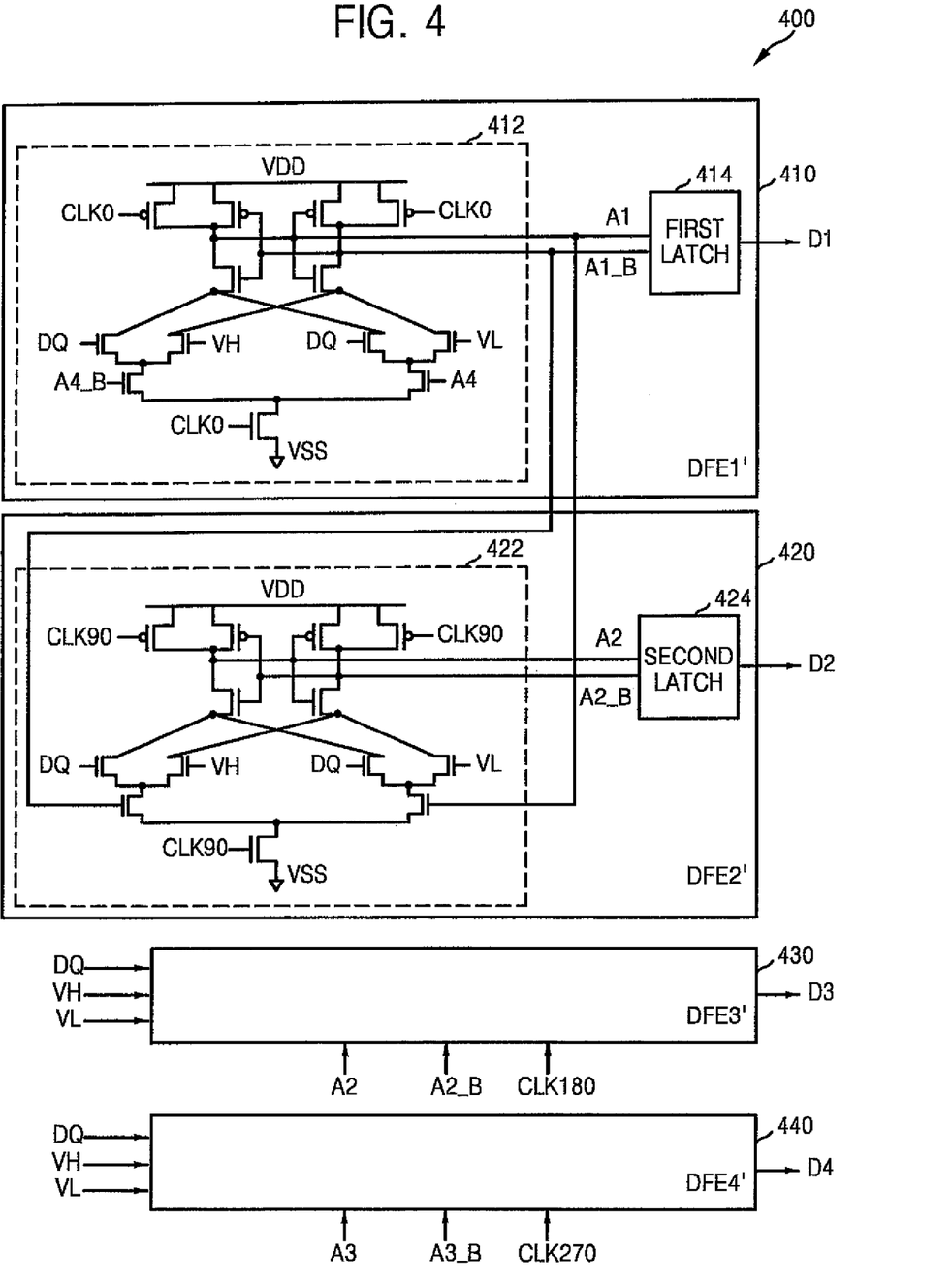
FIG. 4 is a circuit diagram of a four interleaved loop unrolling DFE receiver according to an embodiment of the present invention.
Figure 5:
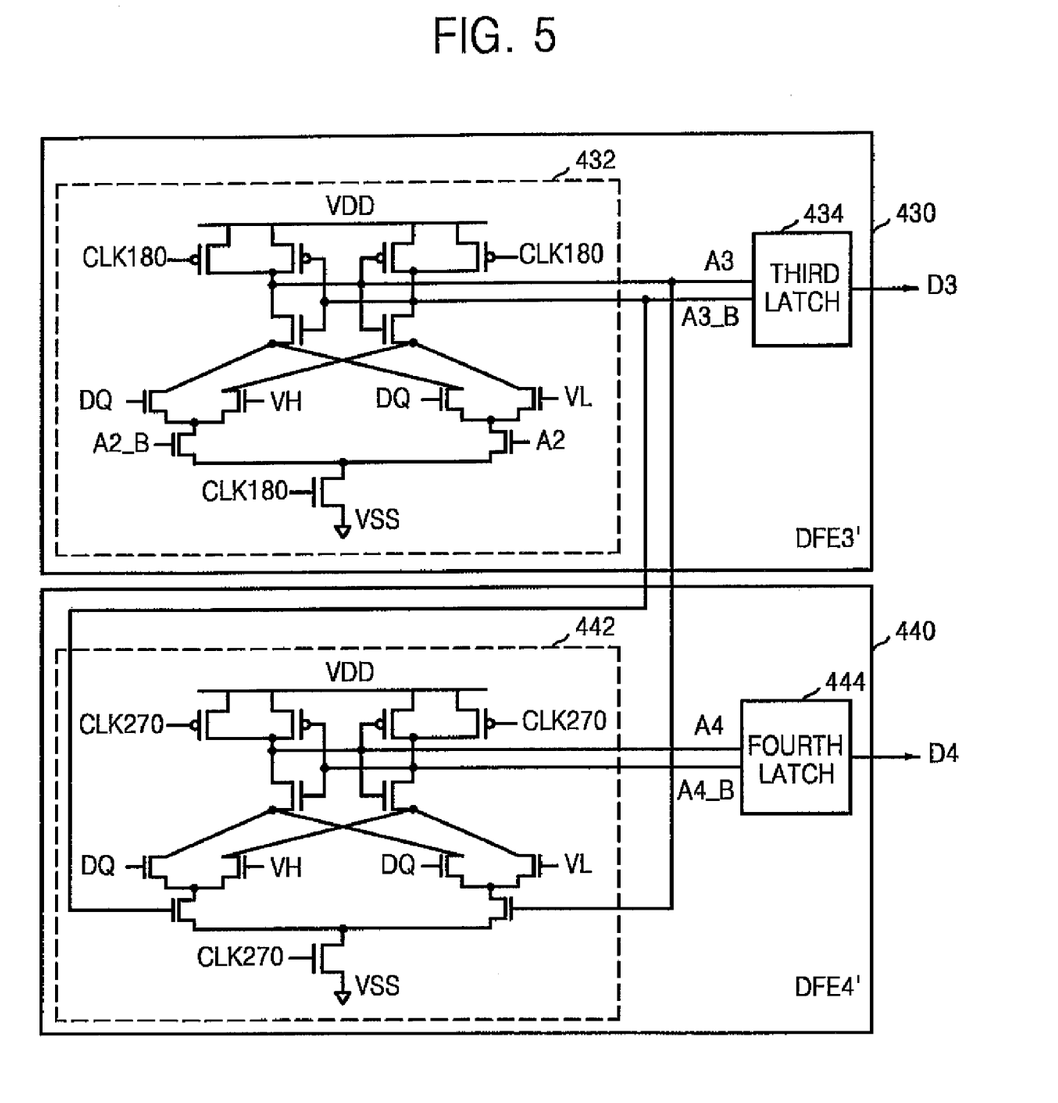
FIG. 5 is a circuit diagram of third and fourth equalizers of FIG. 4 according to an embodiment of the present invention.

FIG. 4 is a circuit diagram of a four interleaved loop unrolling DFE receiver 400 according to an embodiment of the present invention. FIG. 5 is a circuit diagram of third and fourth equalizers of FIG. 4. Referring to FIGS. 4 and 5, the receiver 400 includes a first equalizer DFE1' 410, a second equalizer DFE2' 420, a third equalizer DFE3' 430, and a fourth equalizer DFE4' 440. Each of the equalizers 410 through 440 has the same structure except for input and output signals.

Each of the first through fourth equalizers 410-440 determines data values D1, D2, D3, or D4, respectively, of the input data DQ based on the respective first through four clock signals CLK0, CLK90, CLK180, and CLK270, respectively, each having a different phase. For example, the clock signals CLK90, CLK180, and CLK270 of the second through fourth equalizers 420, 430, and 440, respectively, may have phase differences of 90°, 180°, and 270° compared to the phase of the clock signal CLK0 of the first equalizer 410. As a result, each of the equalizers 410 through 440 sequentially determines the input data DQ based on each of the clock signals CLK0 through CLK270 and outputs determined data values D1 through D4.

Each of the equalizers 410, 420, 430, and 440 includes a sense amplifier unit and a latch unit. DFE receiver 400 includes a first sense amplifier 412, a second sense amplifier 422, a third sense amplifier 432, and a fourth sense amplifier 442. The DFE receiver 400 further includes a first latch 414, a second latch 424, a third latch 432, and a fourth latch 444.

The first sense amplifier 412 is operated based on the first clock signal CLK0 and control signals A4 and A4_B. The control signals A4 and A4_B are output signals of the fourth sense amplifier 442 of the fourth equalizer 440. The first sense amplifier 412 differentially amplifies the difference between the input data DQ and high reference voltage VH, and outputs the differentially amplified difference, or differentially amplifies the difference between the input data DQ and the low reference voltage VL, and outputs the differentially amplified difference, based on the output signal A1 and A1_B of the fourth sense amplifier 442. The first latch 414 outputs the value D1 of the input data DQ based on the output signal A1 and A1_B of the first sense amplifier 412.

Figure 6:
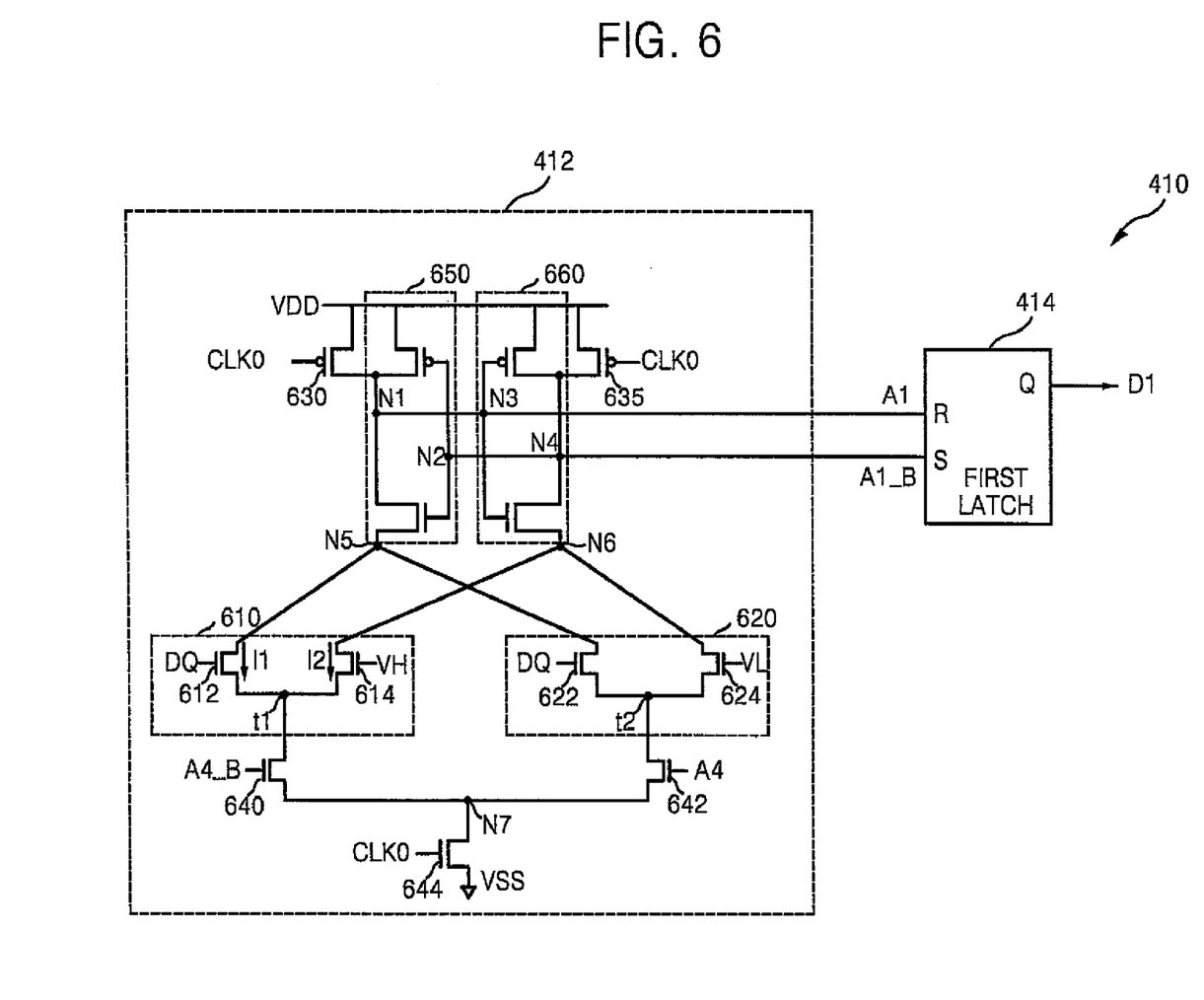
FIG. 6 is a circuit diagram further detailing an equalizer according to an embodiment of the present invention.

FIG. 6 is a circuit diagram further detailing the equalizer 410 of FIG. 4. Equalizers 420, 430, and 440 shown in FIGS. 4 and 5 have the same structure except for input and output signals. Also, since the operation of each of the equalizers 420 430, and 440 is similar to that of the first equalizer 410, the descriptions thereof will be omitted herein for brevity.

Referring to FIG. 6, the first equalizer 410 includes the first sense amplifier 412 and the first latch 414. The first sense amplifier 412 includes a first differential transistor pair 610, a second differential transistor pair 620, precharge transistors 630 and 635, selection transistors 640 and 642, bias transistor 644, and a pair of cross-coupled inverters 650 and 660.

The first differential transistor pair 610 amplifies the difference between the input data DQ and the high reference voltage VH. The second differential transistor pair 620 amplifies the difference between the input data DQ and the low reference voltage VL.

The selection transistors 640 and 642, and the bias transistor 644, selectively block an electrical path between the first differential transistor pair 610 or the second differential transistor pair 620 and voltage source VSS based on the control signals A4 and A4_B and the clock signal CLK0.

The cross-coupled inverters 650 and 660 amplify a change in the voltage level generated by operation of the first differential transistor pair 610 or the second differential transistor pair 620 and output the amplified voltage level to the first latch 414. The inverter 650 is connected between a fifth node N5 and VDD. The inverter 660 is connected between a sixth node N6 and VDD. The output node N1 of the inverter 650 is connected to an input node N3 of the inverter 660. The input node N2 of the inverter 650 is connected to an output node N4 of the inverter 660. Because of the foregoing connections, the inverter 650 and the inverter 660 may be referred to as being cross-coupled. The inverters 650 and 660 may be, for example, CMOS (complementary metal-oxide semiconductor) inverters.

The first precharge transistor 630 is connected between VDD and the output node N1 of the first inverter 650. The second precharge transistor 635 is connected between VDD and the output node N4 of the second inverter 660. The first clock signal CLK0 is input to the gates of each of the first and second precharge transistors 630 and 635. Accordingly, the precharge transistors 630 and 635 apply a precharge voltage to the output of the cross-coupled inverters 650 and 660 based on the clock signal CLK0.

The first differential transistor pair 610 includes a first transistor 612 and a second transistor 614. The outputs, for example the drains, of the first and second transistors 612 and 614 are respectively connected to the fifth node N5 and the sixth node N6. The input data DQ is input to the gate of the first transistor 612. The high reference voltage VH is input to the gate of the second transistor 614.

The second differential transistor pair 620 includes a third transistor 622 and a fourth transistor 624. The outputs, for example the drains, of the third and fourth transistors 622 and 624 are respectively connected to the fifth node N5 and the sixth node N6. The input data DQ is input to the gate of the third transistor 622. The low reference voltage VL is input to the gate of the fourth transistor 624.

The first selection transistor 640 is connected between the tail t1 of the first differential transistor pair 610 and a seventh node N7. The first tail t1 is a common source of the first and second transistors 612 and 614. The second selection transistor 642 is connected between a second tail t2 of the second differential transistor pair 620 and the seventh node N7. The second tail t2 is a common source of the third and fourth transistors 622 and 624. The output signal A4_B of the fourth sense amplifier 442 is input to the gate of the first selection transistor 640. The output signal A4 of the fourth sense amplifier 442 is input to the gate of the second selection transistor 642. The bias transistor 644 is connected between voltage source VSS and the seventh node N7. The first clock signal CLK0 is input to the gate of the bias transistor 644.

The first latch 414 outputs the value D1 of the input data DQ based on the output signals A1 and A1_B of the first sense amplifier 412. The first latch 414 may be, for example, a Set-Reset (S-R) latch formed of a NOR gate. The output signal A1 of the first sense amplifier 412 is input to a reset terminal of the first latch 414. The output signal A1_B of the first sense amplifier 412 is input to a set terminal of the first latch 414. When the output signal A1 is in a low level and the output signal A1_B is in a high level, the output D1 of the first latch 414 is in a high level.

In the first sense amplifier 412, the first precharge transistor 630 and the second precharge transistor 635 may be PMOS (P-channel metal-oxide semiconductor) transistors, the first and second inverters 650 and 660 may be CMOS inverters, and the first through fourth transistors 612, 614, 622, and 624, the first and second selection transistors 640 and 642, and the bias transistor 644 may be NMOS(N-channel metal-oxide semiconductor) transistors.

In response to a falling edge of the first clock signal CLK0, the first precharge transistor 630 and the second precharge transistor 635 are turned on and the first node N1 and the fourth node N4 are charged to a level of the source voltage VDD. At this moment, since the bias transistor 644 is turned off, the first sense amplifier 412 is not operated. In response to a rising edge of the first clock signal CLK0, the bias transistor 644 is turned on and the first sense amplifier 412 is enabled.

When the output D4 of the fourth latch 444 of the fourth equalizer DFE4' 440 is in a high level, the first output signal A4 of the fourth sense amplifier 442 is a low level voltage and the second output signal A4_B is a high level voltage. Accordingly, the first selection transistor 640 is turned on while the second selection transistor 642 is turned off. Thus, the first differential transistor pair 610 is operated while the second differential transistor pair 620 is not operated. Consequently, when the output D4 of the fourth latch 444 is in a high level, the first differential transistor pair 610 of the first sense amplifier 412 is operated.

Since the outputs A4 and A4_B of the fourth sense amplifier 442 are output signals from the fourth sense amplifier 442 which are input to the fourth latch 444 of the fourth equalizer 440, the signals are analog signals unlike the digital signal DV4 of FIG. 3. Furthermore, there is no feedback delay due to latches in the operation of the DFE receiver 400. This is in contrast to the operation of DFE receiver 300, which is delayed by latches 314 and 324.

Also, the first and second selection transistors 640 and 642 have a current mode logic (CML) structure to the tail current of the first differential transistor pair 610 or the second differential transistor pair 620. Thus, even when the voltage difference between the first and second output signals A4 and A4_B of the fourth sense amplifier 442 is not great, the first and second selection transistors 640 and 642 can perform a selection operation. Therefore, the operation speed of the semiconductor device, for example, a DRAM, using the DFE receiver according to an embodiment of invention increases.

When the voltage of the data DQ input to the first sense amplifier 412 is smaller than the high reference voltage VH, a first current I1 flowing in the first transistor 612 is smaller than a second current I2 flowing in the second transistor 614. That is, since the second current I2 is relatively greater than the first current I1, the voltage of the fourth node N4 or the voltage of the second node N2 decreases while the voltage of the first node N1 increases.

The increased voltage of the first node N1 is input to the third node N3 that is an input of the second inverter 660. As a result, the voltage of the fourth node N4 is further decreased. By the repetition of these operations, the first node N1 becomes a logical high level and the fourth node N4 becomes a logical low level.

The logical high level of the first node N1 is input to the reset terminal of the first latch 414, for example, an S-R latch. The logical low level of the fourth node N4 is input to the set terminal of the first latch 414. Thus, the output D1 of the first latch 414 becomes a logical low level.

When the voltage of the data DQ input to the first sense amplifier 412 is greater than the high reference voltage VH, the second current I2 flowing in the second transistor 614 is smaller than the first current I1 flowing in the first transistor 612. That is, since the second current I2 is relatively smaller than the first current I1, the voltage of the first node N1 or the voltage of the third node N3 decreases while the voltage of the fourth node N4 or the voltage of the second node N2 increases.

The increased voltage of the fourth node N4 is input to the second node N2 that is an input of the first inverter 650. As a result, the voltage of the first node N1 is further decreased. By the repetition of these operations, the fourth node N4 becomes a logical high level and the first node N1 becomes a logical low level.

The logical low level of the first node N1 is input to the reset terminal of the first latch 414, for example, an S-R latch. The logical high level of the fourth node N4 is input to the set terminal of the first latch 414. Thus, the output D1 of the first latch 414 becomes a logical high level.

Next, when the output D4 of the fourth latch 444, for example, an S-R latch, of the fourth equalizer DFE' 440 is in a low level, the first output A4 of the fourth sense amplifier 442 is a high level voltage and the second output A4_B is a low level voltage. Accordingly, the first selection transistor 640 is turned off and the second selection transistor 642 is turned on. Thus, the first differential transistor pair 610 is not operated while the second differential transistor pair 620 is operated. The determination of the input data DQ is performed in the same method as one described above.

Figure 7:
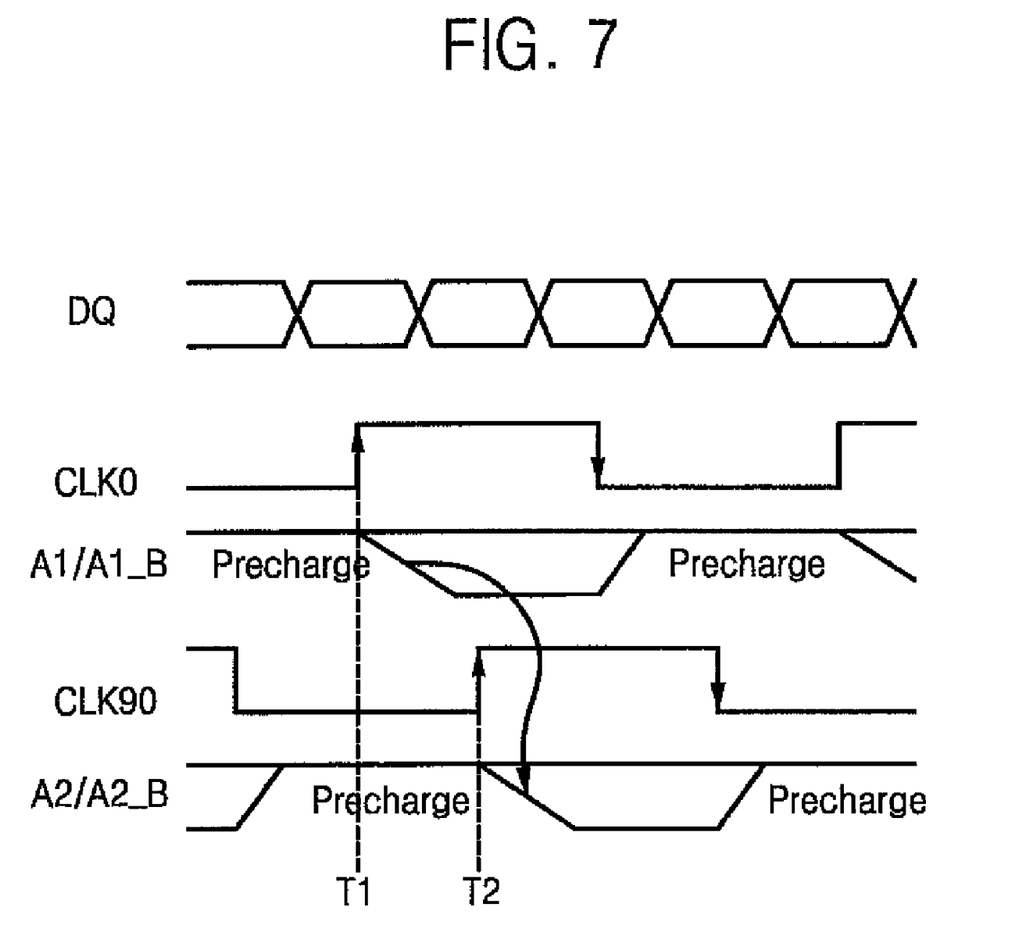
FIG. 7 is a timing diagram illustrating the operation of the receiver of FIG. 4 according to an embodiment of the present invention.

FIG. 7 is a timing diagram illustrating the operation of the receiver 400 of FIG. 4. Referring to FIGS. 4 and 7, when the first clock signal CLK0 is in a low level, the output signal A1 and A1_B of the first sense amplifier 412 becomes a precharge voltage. The first sense amplifier 412 starts to sense the data DQ from a point T1 when the first clock signal CLK0 is shifted to a high level, that is, a rising edge. Likewise, the second sense amplifier 422 outputs a precharge voltage when the second clock signal CLK90 is in a low level and starts to sense the data DQ from a point T2 when the second clock signal CLK90 is shifted to a high level. Since in FIG. 7 the operation timings of the third sense amplifier 432 and the fourth sense amplifier 442 are similar to one described above, descriptions and illustrations will be omitted herein.

Since in each of the equalizers DFE1' through DFE4' the two SAFFs 312 and 322 and the single multiplexer 330 shown in FIG. 3, are replaced by the single SAFF, the maximum operation speed is increased and the circuit size and current consumption are reduced.

The above-described data receiver according to the present embodiment can be applied to a semiconductor device, for example, a DRAM, SRAM, or a flash memory, that interfaces in parallel with external devices through a plurality of transmission lines. In this case, the semiconductor device may have a data receiver corresponding to each of the transmission lines. Each of the data receivers can receive data input through a corresponding transmission line, While this invention has been particularly shown and described with reference to illustrated embodiments, it will be understood by those skilled in the art that various changes in form and details may be made therein without departing from the spirit and scope of the invention as defined by the appended claims.

What is claimed is:

1. A data receiver comprising a plurality of equalizers, each of the plurality of equalizers including:
 a sense amplifier configured to selectively sense and amplify a difference between input data and a first reference voltage or a difference between the input data and a second reference voltage in response to a clock signal and a plurality of control signals; and
 a latch coupled to the sense amplifier and configured to latch an output signal of the sense amplifier, the plurality of control signals being output signals of the sense amplifier included in another one of the plurality of equalizers,
 wherein the sense amplifier comprises:
 a first differential transistor pair configured to receive the input data and amplify a difference between the in input data and the first reference voltage; and
 a second differential transistor pair configured to receive the in input data and amplify a difference between the input data and the second reference voltage, the output of the first differential transistor pair coupled to the output of the second differential transistor pair.

2. The data receiver of claim 1, wherein the first reference voltage is a relatively high voltage and the second reference voltage is a relatively low voltage.

3. The data receiver of claim 1, wherein the clock signal in each of the plurality of equalizers is out of phase with respect to the clock signal in each of the other plurality of equalizers.

4. The data receiver of claim 3 wherein the clock signal in each of the plurality of equalizers is out of phase with respect to the clock signal in the other one of the plurality of equalizers by 90 degrees.

5. The data receiver of claim 1, wherein the sense amplifier comprises:
 a first selection transistor coupled to the first differential transistor pair and configured to selectively block an electrical path between the first differential transistor pair and a voltage source based on at least one of the plurality of control signals; and
 a second selection transistor coupled to the second differential transistor pair and configured to selectively block an electrical path between the second differential transistor pair and the voltage source based on at least another one of the plurality of control signals.

6. The data receiver of claim 1, further comprising:
a bias transistor coupled to the first selection transistor, the second selection transistor, the voltage source and the clock signal.

7. The data receiver of claim 1, wherein the sense amplifier comprises a pair of cross-coupled inverters coupled to the output of the first differential transistor pair and the second differential transistor pair, the pair of cross-coupled inverters configured to amplify the output of the first differential transistor pair and the second differential transistor pair.

8. The data receiver of claim 7, wherein the sense amplifier comprises a plurality of pre-charge transistors coupled to the output of the pair of cross-coupled inverters, the plurality of precharge transistors configured to supply a pre-charge voltage to the output of the pair of cross-coupled inverters in response to the clock signal.

9. The data receiver of claim 7, wherein the latch is configured to store a logic level value of the input data based on output voltages of the pair of cross-coupled inverters.

10. A semiconductor device having a plurality of the data receivers according to claim 1.

11. The semiconductor device of claim 10, wherein the semiconductor device is coupled with an external device through a plurality of transmission lines, and wherein each of the plurality of data receivers is coupled to a corresponding one of the plurality of transmission lines.

12. The semiconductor device of claim 11, wherein the semiconductor device is a DRAM.

13. A data receiver having a plurality of equalizers, each one of the plurality of equalizers having a sense amplifier and a latch, the sense amplifier comprising:
a first differential amplifier configured to amplify a difference between input data and a first reference voltage;
a second differential amplifier configured to amplify a difference between the input data and a second reference voltage;
a selection circuit coupled to the first differential amplifier and the second differential amplifier, the selection circuit configured to activate the first differential amplifier based on a first control signal from another one of the plurality of equalizers and a clock signal, the selection circuit configured to activate the second differential amplifier based on a second control signal from the other one of the plurality of equalizers and the clock signal and
a final amplifier coupled to the first and second differential amplifiers and configured to amplify an output of the first and second differential amplifiers.

14. The data receiver of claim 13, the sense amplifier further comprising:
a precharger coupled to the final amplifier, the precharger configured to supply a precharge voltage to an output of the final amplifier based on the clock signal.

15. The data receiver of claim 14, wherein the first differential amplifier includes a first transistor and a second transistor, the input data coupled to a gate of the first transistor, the first reference voltage coupled to a gate of the second transistor, the source of the first transistor coupled to the source of the second transistor to form a first common source, the drain of the first transistor and the drain of the second transistor coupled to the output of the first differential amplifier.

16. The data receiver of claim 15, wherein the second differential amplifier includes a third transistor and a fourth transistor, the input data coupled to a gate of the third transistor, the second reference voltage is coupled to a gate of the fourth transistor, the source of the second transistor coupled to the source of the fourth transistor to form a second common source, the drain of the third transistor and the drain of the fourth transistor coupled to the output of the second differential amplifier.

17. The data receiver of claim 16, wherein the selection circuit includes:
a first selection transistor coupled to the first common source, the first selection transistor configured to be activated by the first control signal; and
a second selection transistor coupled to the second common source, the second selection transistor configured to be activated by the second control signal.

18. The data receiver of claim 17, wherein the selection circuit includes a bias transistor coupled to the first selection transistor, the second selection transistor, and a first supply voltage, the bias transistor configured to couple a bias voltage to the first selection transistor and the second selection transistor based on the clock signal.

19. The data receiver of claim 18, wherein the final amplifier includes:
a first inverter coupled to the drain of the first transistor; and
a second inverter coupled to the drain of the second transistor.

20. The data receiver of claim 19, wherein an output of the first inverter is coupled to an output of the second inverter, and wherein an output of the second inverter is coupled to an input of the first inverter.

* * * * *